United States Patent [19]
Davis et al.

[11] 4,041,440
[45] Aug. 9, 1977

[54] METHOD OF ADJUSTING RESISTANCE OF A THICK-FILM THERMISTOR

[75] Inventors: James L. Davis; Keith E. Ewing, both of Kokomo, Ind.

[73] Assignee: General Motors Corporation, Detroit, Mich.

[21] Appl. No.: 686,151

[22] Filed: May 13, 1976

[51] Int. Cl.² ............................................. H01C 10/00
[52] U.S. Cl. ...................................... 338/195; 29/620;
                                              323/94 R; 338/22 R
[58] Field of Search ................. 338/195, 22, 307, 308,
                                    338/309; 323/94 R; 29/620

[56]                  References Cited
              U.S. PATENT DOCUMENTS

| 3,134,953 | 5/1964  | Eislor ................................ 29/620 X |
| 3,284,878 | 11/1966 | Best ...................................... 29/670 |
| 3,512,254 | 5/1970  | Jenkins et al. ........................ 29/620 |
| 3,669,733 | 6/1972  | Allington ............................ 29/620 X |
| 3,936,789 | 2/1976  | Matzen et al. .................... 338/225 D |
| 3,947,801 | 3/1976  | Bube ...................................... 338/308 |

Primary Examiner—C. L. Albritton
Attorney, Agent, or Firm—Robert J. Wallace

[57] ABSTRACT

A functionally adjusted thick-film thermistor-resistor network having an accurately preselected electrical resistance and change of electrical resistance with temperature, and a method of forming the same. The network features a thermistor and/or a conductor segment contacting the thermistor having a plurality of parallel paths. Some of the paths preferably provide a different resistance change with temperature than others. A selected number of the parallel paths are severed during functional testing to adjust the thermistor to a preselected change in network resistance with change in temperature. The resistor is functionally adjusted in the usual manner to obtain the selected total network resistance value at room temperature.

7 Claims, 4 Drawing Figures

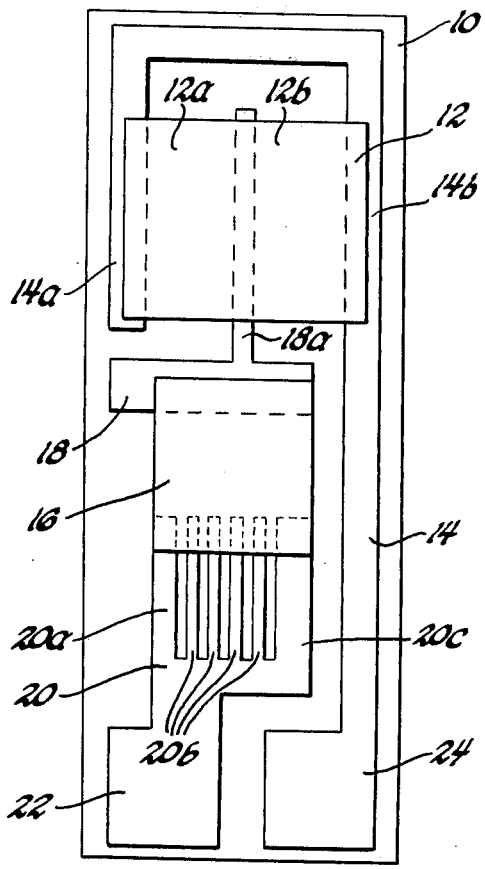
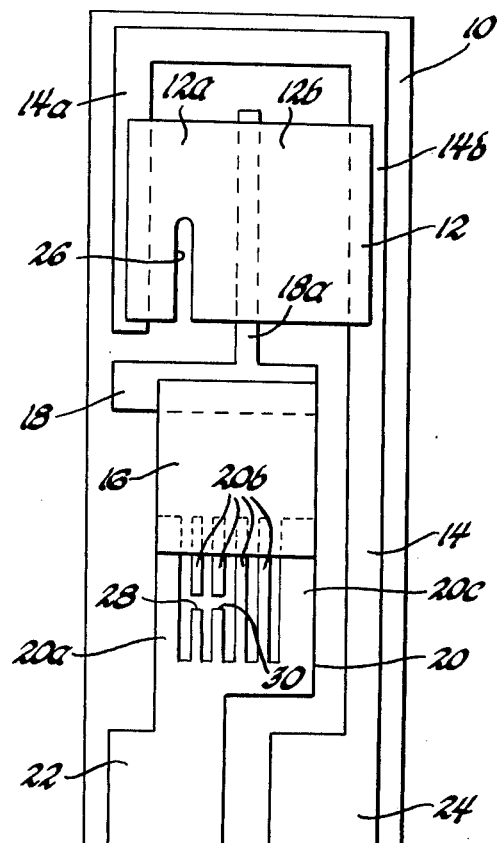
Fig.1
Fig.2
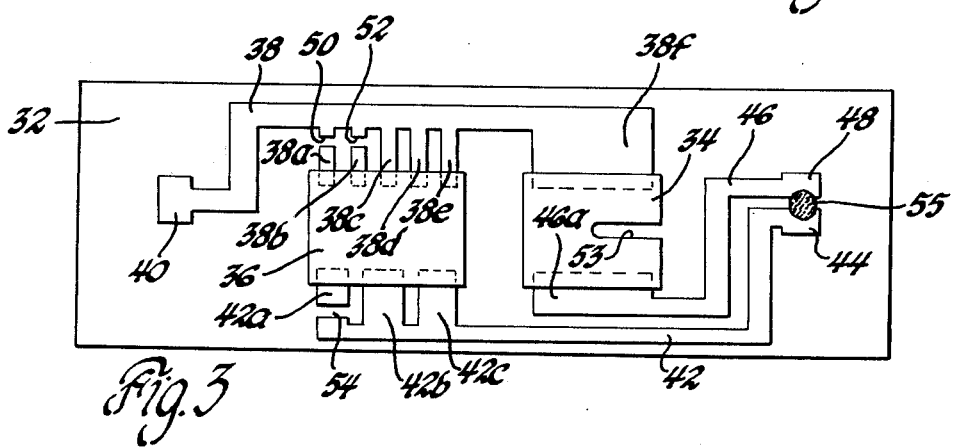
Fig.3
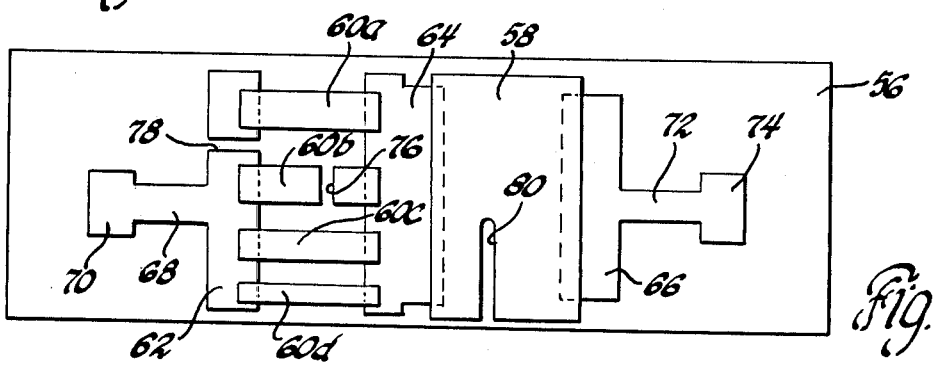
Fig.4

METHOD OF ADJUSTING RESISTANCE OF A THICK-FILM THERMISTOR

BACKGROUND OF THE INVENTION

This invention relates to functional adjustment of a thick-film circuit containing a thick-film thermistor. More specifically this invention involves a thick-film thermistor-resistor network having a unique configuration which permits rapid functional adjustment of the thermistor as well as the resistor, and to a method of functionally adjusting this network.

Thick-film circuits are conventionally made by silk screening resistive and conductive compositions onto a ceramic substrate in a selected pattern. The substrate is then fired to fix the properties of the compositions and bond them to the substrate surface. Thick-film printed resistors are normally produced with resistance values that vary within rather wide tolerances. When higher accuracy is necessary, it is customary to functionally adjust the more significant thick-film printed resistors, and sometimes all of the resistors, to more precise resistance value.

A thick-film printed resistor is functionally adjusted by cutting a transverse groove partially across the resistor, deeper than resistor film thickness, to reduce resistor effective width. The resistance value of the resistor is substantially continuously monitored while the groove is being cut. When the resistance increases to a predetermined value, cutting of the groove is stopped. The groove can be cut by a narrow jet of air carrying a fine abrasive. This air abrade technique, in principle, should be useful in trimming a thick-film printed thermistor to an accurate preselected value. However, the abrasion of the thermistor material heats the thermistor, changing its resistance value while it is being cut. Concurrently, the jet of air carrying the abrasive has a cooling effect, which also changes the resistance value. Neither effect is consistent or known by applicants to be controllable. Trimming a thermistor by this technique is possible by successively cutting, checking, recutting, rechecking, etc. However, this is impractical for high volume commercial production applications. Too much time would be lost waiting for the temperature of the thermistor to equilibrate after each cut and recut. Thick-film printed resistors can also be trimmed using a laser beam to cut the transverse groove, instead of the air abrade technique. However, the laser beam heats the thermistor material as the thermistor is being trimmed. Consequently, laser trimming in the usual manner also is not practical for high volume commercial production applications. Hence, where a precise thermistor value was needed in a thick-film circuit made in high volume, it was not normally practical to include it as a thick-film component.

We have now found a unique thick-film circuit pattern for a thick-film printed thermistor that can be rapidly functionally adjusted by either an air borne abrasive or a laser beam. It can now be trimmed in the same manner and at the same speed as a resistor. Accordingly, we have discovered a new way of trimming a thick-film printed thermistor that is practical for high volume commercial production applications.

OBJECTS AND SUMMARY OF THE INVENTION

It is, therefore, an object of this invention to provide a unique thick-film network that includes a thick-film thermistor that can be rapidly functionally adjusted.

It is also an object of this invention to provide a functionally adjusted thick-film network having a unique thick-film pattern, especially for a thermistor-resistor series network.

A still further object of the invention is to provide a method of rapidly trimming a thick-film thermistor in a thick-film network to a predetermined change in electrical resistance with change in temperature.

These and other objects of the invention are obtained with a thick-film network, especially a thermistor-resistor series network, featuring a thermistor and/or a conductor segment contacting the thermistor in which one of them has a plurality of parallel paths. Preferably, some of these paths provide a different thermistor resistance than other paths and thereby provide a different network electrical resistance change with temperature change. In trimming the thermistor, one or more of the parallel paths are completely severed. Some of the parallel paths are completely severed during functional adjustment. This accurately changes as-printed thermistor resistance to a preselected value, to provide a more accurate preselected change in network electrical resistance with change in temperature. The paths are completely severed and the portions where severed are sufficiently spaced from remaining active thermistor portions to avoid deleterious heating or cooling effects on them due to the trimming operation. Resistors in the network are then functionally adjusted in the usual manner, preferably by the same means used to trim the thermistor, to obtain a selected overall network resistance at room temperature.

BRIEF DESCRIPTION OF THE DRAWINGS:

Other objects, features and advantages of the invention will become more apparent from the following description of preferred embodiments thereof and from the drawing, in which:

FIG. 1 shows a plan view of a thick-film thermistor-resistor series network as printed;

FIG. 2 shows the network of FIG. 1 after functional adjustment;

FIG. 3 shows a plan view of a second embodiment of the invention after functional adjustment; and FIG. 4 shows a plan view of a third embodiment of the invention after functional adjustment.

DESCRIPTION OF THE PREFERRED EMBODIMENTS:

FIG. 1 shows a ceramic substrate 10 of alumina, berylia, or the like having a thick-film thermistor-resistor series network printed on it. By thick-film, we mean a coating, usually a cermet coating, of a thickness of about 0.025 mm and greater such as is produced by screen printing techniques. Ordinarily thicknesses of the order of 0.025 mm are preferred. Significantly thinner coatings are more difficult to satisfactorily print. Significantly thicker coatings provide no electrical advantage and may involve physical and cost disadvantages.

The thick-film network of FIG. 1 is produced by successively silk screening a conductor pattern, a resistor pattern and a thermistor pattern onto the surface of the ceramic substrate 10. The substrate is then fired in the normal and accepted manner to bond the patterns in place and fix their electrical properties. The network comprises a rectangular thick-film resistor 12, opposite ends of which partially overlie spaced legs 14a and 14b of thick-film conductor segment 14. A rectangular thick-film thermistor 16 is on substrate 10 spaced from resistor 12. Opposite ends of thermistor 16 partially overlie a thick-film conductor segment 18 and the ends of fingers 20a, 20b and 20c of conductor segment 20. Conductor 18 has an extension 18a extending under resistor 12 parallel to conductor legs 14a and 14b. The resistor and thermistor are mixed oxide compositions. All of the conductor segments are of a palladium-silver cermet. However, they can be cermets of other conductor materials such as gold, platinum-gold and platinum-palladium-silver.

Conductor 18a is in an electrical contact with resistor 12, and effectively divides it into two parallel resistors 12a and 12b. Thick-film conductor 20 has an enlargement 22 at its free end to facilitate making electrical connection to external circuitry. Similarly thick-film conductor 14 has an enlargement 24 at its free end to facilitate making an electrical connection to external circuitry. With conductors 20 and 14 each connected to opposite poles of a direct current source, current can flow from contact 24 through conductor 14, parallel resistors 12a and 12b, conductor 18 (including conductor 18a), thermistor 16, conductor 20 (including fingers 20a, 20b and 20c), to contact 22. Accordingly, resistors 12a and 12b are in parallel with each other and in series with thermistor 16.

It should also be mentioned that while resistor 12 is in fact shown as parallel resistors 12a and 12b this is only as a matter of convenience in the particular design shown. If desired, resistor 12 can be made as a single resistor. Analogously, conductor 14 is shown in a generally U-shaped configuration with its free end 24 positioned adjacent free end 22 on conductor 20. This configuration permits making electrical connections to both free ends of the network on the same end of the substrate 10. However, free end 24 can be just as readily on the opposite end of substrate 10 from free end 22, similar to the other embodiments of this invention shown in connection with FIGS. 3 and 4.

As previously mentioned, this invention involves a thick-film network containing a thermistor which can be rapidly functionally adjusted by normal and accepted resistor trimming techniques. This is accomplished by providing a plurality of separate parallel paths through the thermistor by means of the conductor segments contacting the thermistor. In the embodiment of the invention shown in connection with FIGS. 1 and 2, the parallel paths are provided in conductor 20. Finger portions 20a, 20b and 20c of conductor 20 provide the parallel paths for thermistor 16. It should also be noted that the widths of the fingers 20a, 20b and 20c are unequal. They are of a width predetermined to provide the closest correspondence to the preselected thermistor characteristics desired, when selected ones are severed. It can be noted that finger 20c is relatively wide. Finger 20a is of moderate width. Fingers 20b are narrow, and several are present, to provide greater opportunity for more precise functional adjustment.

FIG. 2 shows the same thick-film thermistor-resistor series network as shown in FIG. 1, but after functional adjustment. In making functional adjustment, one or more of the thermistor-associated parallel paths contemplated in this invention are completely severed. In FIG. 2, two of the fingers 20b are severed by transverse grooves 28 and 30 that extend completely across them. The grooves 28 and 30 are deeper than the thickness of fingers 20b, so that the two fingers 20b involved are each cut completely into two separate parts. Grooves 28 and 30 are spaced at least about 2 mm from the thermistor 16 to avoid incidentally changing the temperature of thermistor 16 when they are formed. Grooves 28 and 30 form electrically nonconductive gaps in their respective fingers 20b, preventing them from functioning in the network. The average current flow path through thermistor 16 is thereby restricted. This increases the effective resistance of thermistor 16 to a predetermined value. No special modification of the usual resistor trimming equipment or of its principle of operation are required to make grooves 26, 28 and 30. Trimming of both the resistor and the thermistor can be accomplished by either analog or digital techniques. In this connection, we mean that the resistance value can be continuously monitored while the thermistor or the resistor is being trimmed, or trimming can be done in alternate rapid steps of measurement, partial trim, measurement again, further trim, etc. Complete severing of the conductor finger is required because there is little change in the resistance value of the thermistor until the conductive finger is completely severed.

During functional adjustment the resistance across thermistor 16 is monitored with a pair of probes between conductor segment 18 and free end 22. Cutting of the parallel paths for thermistor 16 can be programmed, as one chooses. In one program, one can measure the as-printed resistance value, sever a first leg, check the resistance value again, sever another leg, check the resistance value still again, and so on. On the other hand, it is even more practical to measure the resistance value and compare it, using computer techniques, to the value desired. Appropriate fingers 20a, 20b and 20c can be selected from empirical information previously obtained, and then all the fingers selected cut in one laser cut. Afterwards the thermistor resistance value between conductor segment 18 and free end 22 can be measured again to be sure that the resistance value is within tolerance limits. Final adjustment of the thermistor-resistor network is then made by measuring the total network resistance across free ends 22 and 24. Resistor 12 is then trimmed in the usual manner to obtain overall network resistance adjusted accurately to a predetermined level.

Every thermistor composition has an inherent characteristic of changing its resistivity a given percent per degree change in temperature. A thermistor of a given composition will have a resistance value that changes this same percent per degree change of temperature. Thus, it can be seen that for thermistors of the same composition, the higher the thermistor resistance the greater the rate of resistance change with temperature. Acccordingly, by functionally adjusting a thick-film printed thermistor to a higher resistance value, one increases the rate of change of thermistor resistance with temperature. The rate of change in resistance with temperature is not constant over a wide temperature range. It varies with temperature but according to a predetermined profile. Accordingly, if one knows the thermistor resistance at any specified temperature, he can accurately predict the resistance value it will have for another temperature. Analogously, by functionally adjusting a thick-film printed thermistor to a specified resistance value at a given temperature, its rate of resistance changes with change in temperature is also functionally adjusted. One can consider this as changing the slope of the thermistor temperature-resistance profile.

In view of the foregoing, it can be seen that thermistor 16 can be functionally adjusted at any preselected temperature. In commercial production, the resistance value, and change of resistance with temperature, of thermistor 16 is most conveniently set at a temperature somewhat above room temperature, as for example 30° C. After the substrate is stabilized at this temperature, which takes about ten seconds, the thermistor can be trimmed. Temperature stabilization can be achieved during processing steps immediately before functional adjustment, to avoid production delay. It is most practical to also functionally adjust the resistor at this temperature. The thermistor is trimmed first to set its resistance to a preselected value and obtain the corresponding network change of resistance with temperature. Afterwards the resistor 12 is trimmed to produce an overall network resistance accurately corresponding to a preselected value.

This invention is not restricted to an electrical arrangement in which the thermistor and resistor are electrically connected in series. Moreover, the multiple current paths are not physically restricted to the one thermistor side shown in FIGS. 1 and 2. They can be on either side, or on both sides. FIG. 3 shows them on both sides in a thick-film network where the thermistor and resistor are electrically in parallel.

FIG. 3 shows a thermistor-resistor thick-film network printed on a ceramic substrate 32, in the same manner as the preceding embodiment of the invention. The pattern includes a thick-film rectangular resistor 34 and a thick-film rectangular thermistor 36 spaced from resistor 34. A first thick-film conductor segment 38 on the face of substrate 32 extends from a central area on the left of substrate 32, where it has an enlarged free end 40 that facilitates making external electrical connections. It extends from enlarged free end 40 toward the upper edge of the substrate face where it parallels this edge and extends past thermistor 36 to resistor 34. Segment 38 has fingers 38a, 38b, 38c, 38d and 38e which extend transversely to a region beneath thermistor 36. The end of conductor segment 38 adjacent resistor 34 is enlarged at 38f and the enlargement is overlapped by resistor 34. The enlargement 38f effectively forms a wide finger which extends transversely beneath resistor 34. Accordingly, conductor segment 38 is in electrical communication with both thermistor 36 and resistor 34.

A second thick-film conductor segment 42 is on the surface of substrate 32. It extends from an enlarged free end 44 on a central area of the right substrate face, down toward the lower edge of the face, where it parallels this edge to a region below thermistor 36. It has fingers 42a, 42b and 42c which transversely extend up to and beneath thermistor 36, providing electrical communication between thermistor 36 and second conductor segment 42. A third thick-film conductor segment 46 is on substrate 32. It has an enlarged free end 48 close to but spaced above enlarged free end 44. From enlarged free end 48, it extends downwardly to the left of second conductor segment 42 and then above it along the lower part of substrate 32 until reaching a region below resistor 34. Third conductor segment 46 has an enlarged end 46a that is overlapped by resistor 34 analogous to the enlarged end 38f on first conductor segment 38 thus, third conductor segment 46 is in electrical communication with resistor 34.

The enlarged free ends on the conductor segments 38, 44 and 46 can be disposed on the same end of substrate 32 if desired. However, they are shown on opposite ends of substrate 32 to illustrate that the conductor ends are not restricted to the configuration shown in FIGS. 1 and 2.

As can be seen, first conductor segment 38 has five narrow fingers 38a, 38b, 38c, 38d and 38e, the ends of which are overlapped by one end of thermistor 36. Analogously, the second conductor segment 42 has three wide fingers 42a, 42b and 42c. Their ends are overlapped by the opposite end of thermistor 36. Fingers 38a and 38b have transverse grooves 50 and 52 extending completely across their width. The grooves 50 and 52 are spaced at lest 2 mm from thermistor 36. They are deeper than the thickness of fingers 38a and 38b. Hence, they each sever and electrically isolate their respective fingers so that the finger portions contacting thermistor 36 are electrically isolated from first conductor segment 38. Finger 42a is similarly severed at 54. Accordingly there are gaps 50 and 52 to prevent electrical communication between thermistor 36 and first conductor segment 38 through fingers 38a and 38b, respectively. The gap 54 in finger 42a prevents electrical communication between thermistor 36 and the second conductor segment 42 through finger 42a. Gaps 50, 52 and 54 thus increase the as-printed resistance of thermistor 36 between conductor segments 38 and 42 to a predetermined value.

A groove 53 extends transversely partially across resistor 34, increasing its as-printed resistance value. With groove 53 setting the value of resistor 34 and gaps 50, 52 and 54 setting the value of thermistor 36, resistance is set to change according to a predetermined profile.

The enlarged free ends 44 and 48 on second conductor segment 42 and third conductor segment 46, respectively, are shown closely adjacent one another. If their spacing is within about 0.25 mm, a dab of solder 55 placed on them can readily bridge the gap therebetween. In such instance, a single terminal wire can be simultaneously soldered to both enlarged free ends 44 and 48. This simultaneously completes the parallel connection therebetween and provides a single connection for external circuitry. In some instances it may not be desired to electrically directly communicate second and third conductor segments 42 and 46. In such instance, they would be spaced further apart, and separate electrical connections made to them in the usual manner.

FIG. 3 shows multiple current paths on both sides of the thermistor 36. The network in FIG. 3 has thermistor 36 and resistor 34 electrically in parallel. Multiple current paths can be used on both sides of the thermistor in a series type network too. Moreover, multiple current paths can be used only between the thermistor and the resistor in a series type network. However, when conductor fingers are used between a thermistor and a resistor connected in series, the conductor fingers should not extend from the thermistor directly to the resistor. Instead, they should extend to a common bus portion that overlaps the resistor. Thus resistance across the thermistor and across the resistor can be separately tested. Moreover severing one of the thermistor-associated fingers will not change the resistor value.

FIG. 4 illustrates another approach to multiple thermistor-associated paths. Multiple parallel paths may be provided in the thermistor itself by printing it as a plurality of discrete parallel bars. In such instance no fingers need be provided at all in the conductor segments contacting the bars. FIG. 4 shows a ceramic substrate 56 with a thick-film thermistor-resistor series network printed on its surface in the same manner as the preceding examples of this invention. A rectangular thick-film resistor 58 is printed on the substrate surface. Spaced from resistor 58 is a plurality of parallel thick-film bars 60a, 60b, 60c and 60d of thermistor material. Parallel bars 60a, 60b, 60c and 60d can be considered as being segments of a single but composite thermistor. A first thick-film conductor segment 62 is partially overlapped by one end of each of the thermistor bars 60a, 60b, 60c and 60d. The opposite ends of the thermistor bars partially overlap a second thick-film conductor segment 64. Resistor 58 also partially overlaps conductor segment 64, as well as a third thick-film conductor segment 66. Conductor segment 62 has an extension 68 with an enlarged free end 70 for connection of external leads. Similarly conductor segment 66 has an extension 72 with an enlarged free end 74 for connection of external leads.

Thermistor bar 60b is completely severed by a transverse groove 76, whereby no electrical current can flow between conductor segment 62 and 64 through thermistor bar 60b. Analogously, conductor segment 62 is transversely severed by a transverse groove at 78 so that no electrical current will pass through thermistor bar 60a from conductor segment 62. The grooves are sufficiently deep to extend through the thickness of the thick-film components into the surface of substrate 56. Accordingly, thermistor bars 60c and 60d provide a network change of electrical resistance with temperature corresponding to an accurately predetermined value. Total network resistance is functionally adjusted by a groove 80 transversely extending partially across resistor 58.

The multiple bar thermistor configuration of FIG. 4 is not generally preferred. Unless the thermistor bars are widely spaced, at least about 4 mm, the cutting of one thermistor bar is likely to effect the temperature and therefore the resistance value of adjacent thermistor bars. Wider spacing, of course, reduces the density of the circuit involved, increasing its cost.

The parallel thermistor bars 60a, 60b, 60c and 60d can also be printed as fingers extending from a common bus portion of thermistor material similar to electrode segment 20 in FIG. 2. However, the same wide spacing referred to in the preceding paragraph would have to be observed, and the grooves in them cut a similar distance away from the common bus portion. This imposes a further constraint. Accordingly, while we recognize that the thermistor can be formed and adjusted by this technique, it is generally not preferred. In most instances it is preferred to have a single discrete thermistor portion contacted by a conductor segment having a plurality of fingers which are at least about 2.5 mm long. In such instance, they can be severed at a distance of at least about 2 mm away from the thick-film thermistor. In this way, one insures that no heat generated during the severing operation will be transmitted to the thermistor, to affect its resistance value immediately after severing. Accordingly, the thermistor resistance value can be readily checked immediately after severing to be sure that it accurately corresponds to the preselected value.

We claim:

1. A functionally adjusted thick-film thermistor-resistor network having an accurate electrical resistance and change of electrical resistance with temperature corresponding to preselected values, said network comprising:
   a ceramic substrate having a surface;
   a thick-film cermet generally temperature stable resistor bonded to said surface;
   a thick-film cermet thermistor bonded to said surface;
   a plurality of thick-film cermet conductor segments bonded to said surface;
   parts of said thick-film resistor, thick-film thermistor, and thick-film conductor segments overlapping one another and providing an electrical network;
   said thick-film resistor having a non-printed groove therein for increasng as-formed electrical resistance of said thick-film resistor;
   a plurality of parallel paths in one of said thick-film thermistor and a contacting thick-film conductor segment;
   some of said parallel paths having a gap therein completely blocking electrical current flow therethrough, so as to electrically isolate each such path in said network; and
   the remainder of said parallel paths being continuous and providing thermistor resistance, and change in network electrical resistance with change in temperature, accurately corresponding to a functionally tested preselected value.

2. A functionally adjusted thick-film thermistor-resistor network having an accurate electrical resistance and change of electrical resistance with temperature corresponding to preselected values, said network comprising:
   a ceramic substrate having a surface;
   a thick-film cermet generally temperature stable resistor bonded to said surface;
   a thick-film cermet thermistor bonded to said surface;
   a plurality of thick-film cermet conductor segments bonded to said surface;
   parts of said thick-film resistor, thick-film thermistor and thick-film conductor segments overlapping one another and providing an electrical network;
   said thick-film resistor having a non-printed transverse groove extending partially across its width for increasing as-formed electrical resistance of said thick-film resistor;
   a plurality of fingers in one of said thick-film thermistor and a contacting thick-film conductor segment;
   a selected number of said fingers being continuous and providing a preselected and functionally adjusted thermistor resistance, and change in network electrical resistance with change in temperature;
   at least one of said fingers not included in said selected number; and
   a non-printed groove completely severing each of such fingers not included in said selected number and prohibiting that electrical current flow therethrough.

3. A functionally adjusted thick-film thermistor-resistor network having an accurate electrical resistance and change of electrical resistance with temperature corresponding to preselected values, said network comprising:
   a ceramic substrate having a surface;
   a thick-film cermet generally temperature stable resistor bonded to said surface;
   a thick-film cermet thermistor bonded to said surface;
   a plurality of thick-film cermet conductor segments bonded to said surface;

parts of said thick-film resistor, thick-film thermistor, and thick-film conductor segments overlapping one another and providing an electrical network;

a non-printed transverse groove extending partially across said thick-film resistor for increasing as-formed electrical resistance of said thick-film resistor;

one of said thick-film conductor segments having a bus portion spaced from said thermistor and a plurality of generally parallel fingers extending from said common bus portion to said thermistor;

each of said fingers having a length of at least 2 mm between said common bus portion and said thermistor and having a free end overlapping said thermistor, some of said fingers being wider than others;

a selected number of said fingers being continuous between said common bus and said thermistor so as to provide a preselected and functionally adjusted thermistor resistance, and a change of network electrical resistance with change in temperature;

at least one of said fingers not included in said selected number; and a non-printed groove completely severing each of such fingers not included in said selected number and prohibiting electrical current flow therethrough.

4. A thick-film thermistor-resistor network in which the thermistor can be as rapidly functionally adjusted as the resistor, said network comprising:

a ceramic substrate having a surface;

a thick-film cermet generally temperature stable resistor bonded to said surface;

a thick-film cermet thermistor bonded to said surface;

a plurality of thick-film cermet conductor segments bonded to said surface;

parts of said thick-film resistor, thick-film thermistor and thick-film conductor segments overlapping one another and providing an electrical network;

one of said thick-film conductor segments having a common bus portion spaced from the thermistor and a plurality of generally parallel fingers extending from the bus portion to said thermistor;

each of said fingers having a free end in overlapping relationship with said thermistor and providing an as-formed electrical resistance across said thermistor that generally corresponds to a first preselected value and is less than a second preselected value; and each of said fingers having a length greater than 2 mm by which they can be transversely severed by an erosive resistor trimming process without significantly heating or cooling said thermistor and by which severing thermistor resistance can be as rapidly functionally adjusted to said second preselected value as said resistor is functionally adjusted to its own preselected resistance value.

5. A method of printing and rapidly functionally adjusting a thick-film thermistor in a thick-film electrical network, said method comprising the steps of:

printing one of a thermistor and a contacting thick-film conductor segment on the surface of a ceramic substrate in a configuration having a plurality of current flow paths electrically in parallel, firing the ceramic substrate to bond said thick-films to said surface and fix their properties, including an as-formed electrical resistance across said thermistor; and completely blocking a selected number of said parallel paths that is less than all of them, to prohibit electrical current flow therethrough and increase thermistor resistance to a preselected value, without concurrently significantly changing thermistor temperature.

6. A method of printing and functionally adjusting a thick-film thermistor-resistor network on a ceramic substrate in which the thick-film thermistor is as rapidly functionally adjusted as the thick-film resistor, said method comprising:

printing a thick-film resistor, a thick-film thermistor, and a plurality of thick-film conductor segments on the surface of a ceramic substrate in an overlapping pattern to provide an electrical network;

printing at least one of the thick-film thermistor and a thick-film conductor segment contacting the thick-film thermistor in a configuration having a plurality of current flow paths electrically in parallel;

firing the ceramic substrate to bond said thick-films to said substrate surface and fix their properties;

cutting a groove partially through said thick-film resistor while monitoring its change in electrical resistance and stopping such cutting when electrical resistance has increased to a preselected value; and completely severing at least one of said parallel paths to increase electrical resistance across said thermistor to a preselected value.

7. A method of making and functionally adjusting a thick-film thermistor-resistor network on a ceramic substrate, in which the thermistor is as rapidly functionally adjusted as the resistor, said method comprising the successive steps of:

printing a thick-film resistor, a thick-film thermistor, and a plurality of thick-film conductor segments on the surface of a ceramic substrate in an overlapping pattern to provide an electrical network;

printing at least one of said thick-film conductor segments in a configuration having a plurality of fingers with free ends that overlap the thick-film thermistor, some of said fingers being wider than others;

firing said ceramic substrate to bond said thick-films to said substrate and fix their properties: whereby said thermistor and resistor have resistances less than desired in a finished product;

completely severing at least one of said thick-film conductor segment fingers, whereby thermistor resistance is increased and more accurately conforms to a preselected value; and partially severing said thick-film resistor, whereby resistor resistance is increased and more accurately conforms to a preselected value.

* * * * *